United States Patent [19]

Gahle

[11] Patent Number: 4,475,279
[45] Date of Patent: Oct. 9, 1984

[54] METHOD OF MAKING A MONOLITHIC INTEGRATED CIRCUIT COMPRISING AT LEAST ONE PAIR OF COMPLEMENTARY FIELD-EFFECT TRANSISTORS AND AT LEAST ONE BIPOLAR TRANSISTOR

[75] Inventor: Hans-Juergen Gahle, Emmendingen, Fed. Rep. of Germany

[73] Assignee: ITT Industries, Inc., New York, N.Y.

[21] Appl. No.: 442,053

[22] Filed: Nov. 16, 1982

[30] Foreign Application Priority Data

Nov. 28, 1981 [EP] European Pat. Off. ........ 81109995.1

[51] Int. Cl.³ .................... H01L 21/22; H01L 21/263
[52] U.S. Cl. ..................................... 29/577 C; 29/571; 29/576 B; 148/1.5; 148/187; 357/43; 357/91
[58] Field of Search .................... 148/1.5, 187; 29/571, 29/576 B, 577 C; 357/43, 91

[56] References Cited

U.S. PATENT DOCUMENTS

| | | | |
|---|---|---|---|
| 3,981,072 | 9/1976 | Buie | 29/576 |
| 4,066,917 | 1/1978 | Compton et al. | 357/43 |
| 4,095,252 | 6/1978 | Ochi | 357/43 |
| 4,120,707 | 10/1978 | Beasom | 148/186 |
| 4,256,515 | 3/1981 | Miles et al. | 148/1.5 |
| 4,311,532 | 1/1982 | Taylor | 148/1.5 |
| 4,346,512 | 8/1982 | Liang et al. | 29/571 |
| 4,402,003 | 8/1983 | Blanchard | 357/43 |
| 4,403,395 | 9/1983 | Curran | 29/571 |

OTHER PUBLICATIONS

Polinsky et al., 1973 Int. Electron Device Meeting Tech. Digest, Wash. D.C., 1973, pp. 229–231.
Zimmer et al., IEEE-Trans. Electron Devices, 26 (1979), 390.
Castrucci et al., IBM-TDB, 16 (1974), 2719.

*Primary Examiner*—Upendra Roy
*Attorney, Agent, or Firm*—Donald J. Lenkszus

[57] ABSTRACT

A method for producing a monolithic integrated circuit having at least a pair of complementary field effect transistors and at least one bipolar transistor is described. A stripe of a relatively thin oxide layer formed during the gate oxide process for the field effect transistors separates the emitter region area and collector contact region area of the bipolar transistor. During a separate masked ion implantation step, the base zone doping material of the bipolar transistor is implanted. The emitter zone is diffused from a polycrystalline emitter electrode formed during the processing of the gate electrodes.

8 Claims, 8 Drawing Figures

METHOD OF MAKING A MONOLITHIC INTEGRATED CIRCUIT COMPRISING AT LEAST ONE PAIR OF COMPLEMENTARY FIELD-EFFECT TRANSISTORS AND AT LEAST ONE BIPOLAR TRANSISTOR

BACKGROUND OF THE INVENTION

A method of making a monolithic integrated circuit comprising at least one pair of complementary Si-gate field-effect transistors and at least one NPN type of planar bipolar transistor is described in an article by B. Hoeffinger and G. Zimmer, "New CMOS Technologies", published in "Solid State Devices", 1980, edited by J. E. Carroll, pages 114 to 117. In this method, a region for the NPN bipolar transistor and a region for the P-channel field-effect transistor are formed in one side of the surface of a p-type wafer used as a substrate, and each of these two regions is DC-isolated from the substrate by a PN junction. Following the formation of these two regions, the substrate is provided with a thick oxide layer having openings through which ions are locally implanted using a mask to adjust the threshold voltages of the transistors and the field threshold voltage between the transistors. In addition to the process steps used in conventional Si-gate CMOS technology, a further masking and implantation step is performed to implant the impuriites of the base region of the bipolar transistor. This implantation takes place through a thin oxide layer formed simultaneously with the thin oxide layers in the areas of the field-effect transistors. By two masked ion-implantation steps, first the impurities of the regions of the N-channel field-effect transistor and then the impurities of the regions of the P-channel transistor are introduced into the semiconductor surface as in conventional Si-gate CMOS technology, and the gate electrode formed by etching away the unwanted portions of an n-type electrode material layer are used as a mask. Simultaneously with the formation of the gate electrodes, the emitter electrode of the bipolar transistor is formed on the exposed surface of the base region. From this emitter electrode, the emitter region is diffused into the base region in a subsequent high-temperature process.

With regard to the bipolar transistor, this prior art method has the disadvantage of resulting in a compensated emitter, i.e., an emitter containing impurities of the base region to a considerable extent. The contradictory requirements for a low base resistance and shallow implanted layers, which are necessary to achieve high speeds, cannot be satisfied with the prior art method.

An essential disadvantage of the prior art method is, however, that the bipolar transistor requires considerably more space than the field-effect transistors. Leaving the space required for its substrate region out of account, the bipolar transistor occupies more than twice the area of a field-effect transistor, which is mainly due to the necessary adjustment tolerances. Both the adjustment of the base region in relation to the collector contact and the adjustment of the emitter region in relation to the base are critical.

SUMMARY OF THE INVENTION

Accordingly, one object of the invention is to provide a method which is modified from the conventional CMOS technique and permits the fabrication of a bipolar integrated transistor using, as far as possible, self-adjusting and/or uncritical processes, so that a considerable saving in the space required by the bipolar transistor is achieved.

The invention thus relates to a method which involves the use of n-type electrode material, such as an n-type silicide.

The method according to the invention thus takes advantage of the simplicity of the prior art method, using the processes of the latter in a special manner to fabricate the bipolar transistor. As the processes for fabricating the field-effect transistors remain unchanged, no changes in the electrical properties of these transistors are to be expected.

The greatest space saving will be achieved if the opening of the bipolar transistor is separated by a stripe-like thin oxide layer, while the exposed portions of the semiconductor surface, as viewed from the oxide-layer stripe, are filled, up to the edge of the opening in the thick oxide layer, by the area of the emitter region on one side of the stripe and the area of the collector contact region on other.

In an uncritical masking step, ions are then implanted into the exposed emitter area at such an acceleration energy as to penetrate the thin oxide layer 9 and to form, below the emitter region yet to be formed, a region doped with impurities of the base region to be formed. In a subsequent high-temperature process, this doped region turns into a base region linked with the lateral base region at the semiconductor surface. All openings in the thick oxide layer are preferably rectangular.

Another feature of the method according to the invention is the use of an n-type electrode material layer which is etched to form both the gate electrodes of the field-effect transistors and the emitter and collector electrodes of the bipolar transistor, the two latter electrodes being used as diffusion sources.

BRIEF DESCRIPTION OF THE DRAWINGS

A preferred embodiment of the method according to the invention will now be explained with reference to the accompanying drawings, in which.

DETAILED DESCRIPTION

The substrate used in the method according to the invention is a p-type silicon wafer in one surface side of which a first region 2 and a second region 3 are formed for the NPN bipolar transistor and the P-channel field-effect transistor, respectively, in the known manner. To introduce the dopants into the semiconductor surface, a masked ion-implantation process is preferably used.

Figure 1:
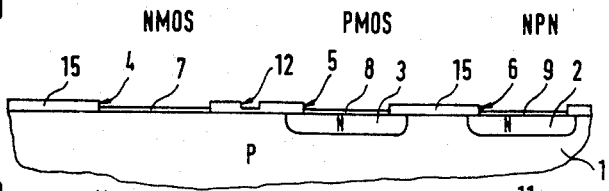
FIGS. 1 and 2 serve to illustrate successive steps of the method according to the invention.

Following the removal of the masking layer necessary for this purpose, a thick oxide layer 15 is produced on the semiconductor surface by thermal oxidation, with either the areas of the substrate regions 2 and 3 and the area of the N-channel field-effect transistor being masked against oxidation of the semiconductor material by means of an oxidation-masking layer of, e.g., silicon nitride, or a thick oxide layer 15 of uniform thickness being formed by thermal oxidation without a mask. To simplify the representation, FIG. 1 relates to the latter case. In the first case, parts of a thick oxide layer are obtained which are buried between the transistors in the semiconductor body. As in the method disclosed in the reference mentioned above, a gate oxidation process is now performed in which the openingclosing thin oxide layers 7, 8 and 9 are produced within the openings 4, 5 and 6, and in which the substrate regions 2 and 3 are formed by activation and diffusion of the dopants, as shown in FIG. 1.

Figure 2:
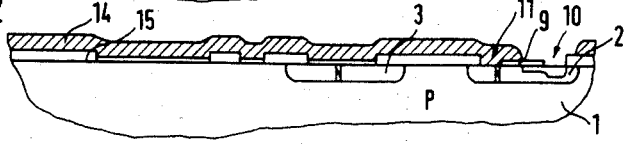

In the method according to the invention, the semiconductor surface is now uncovered in the emitter area 10 and the collector contact area 11 of the bipolar transistor using a photolithographic etching process. Then, as shown in FIG. 2, the ion masking layer 14 is deposited, which leaves the emitter area 10 and an adjacent portion below the thin oxide layer 9 of the bipolar transistor uncovered. Next, ion implantation of impurities of the conductivity type of the base region of the bipolar transistor is performed at such an accelerating voltage that the ions penetrate the thin oxide layer 9 but are slowed down below this exposed portion of the thin oxide layer 9 already at the surface of the semiconductor body.

Figure 3:
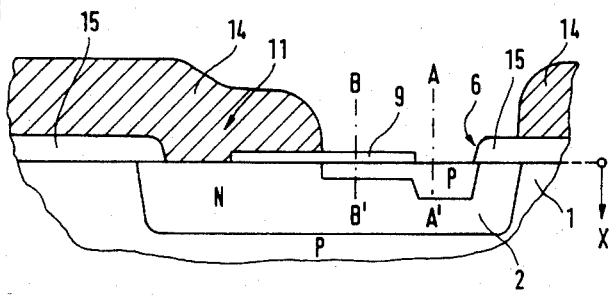
FIG. 3 shows the NPN bipolar transistor of the monolithic integrated circuit.

FIG. 3 shows the portion of the bipolar transistor in an enlarged view. In this FIG. 3, a section is taken along line B—B' perpendicular to the semiconductor surface through the portion of the base region lying below the exposed portion of the thin oxide layer 9, and another section is taken along line A—A' through that portion of the base region which will later lie below the emitter region.

Figure 4:
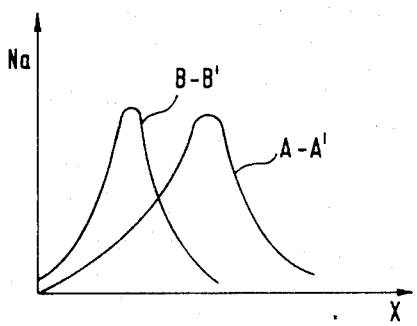
FIG. 4 shows schematically the impurity distribution profiles along the lines B—B' and A—A' of FIG. 3.
Figure 5:
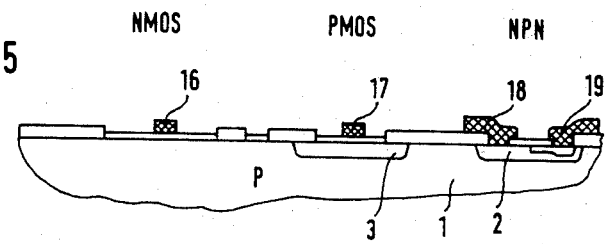
FIGS. 5 to 7 serve to explain further successive steps of the method according to the invention.
Figure 6:
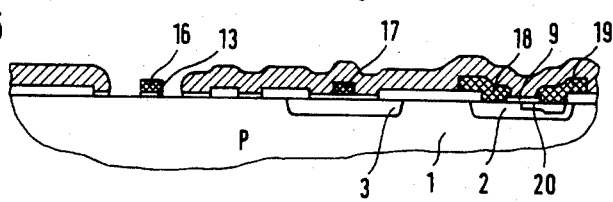

FIG. 4 shows schematically the impurity concentration Na as a function of the depth X along these two lines. It can be seen that the portion of the base region below the emitter region yet to be formed has been placed relatively deep below the semiconductor surface, so that it can be referred to as a "buried" base region. This has the advantages of a non-compensated emitter, i.e., of an emitter containing only relatively few atoms of the base region which have to be overcompensated. The amount of implanted impurities of the base region corresponds directly to the desired current gain. In the embodiment of the method according to the invention, the opening 6 in the thin oxide layer 15 is rectangular and divided by a stripelike thin oxide layer 9, which, together with the area 10 of the emitter region and the area 11 of the collector contact region, fills the opening 6. This has the advantage of permitting non-critical adjustment in the longitudinal direction of the thin oxide layer 9.

Following the implantation of the impurities of the base region 20, the masking layer 14 is removed, and an n-type electrode material layer is deposited on the above-mentioned surface side of the substrate 1, which is covered partly by the thick oxide layer 15 and partly by the thin oxide layers 7, 8, and 9. The n-type electrode material layer is etched using photolithographic techniques to define the gate electrodes 16 and 17 of the field-effect transistors, the emitter electrode 19, and the collector electrode 18 of the bipolar transistor. It is preferably a layer of n-type silicon.

Figure 7:
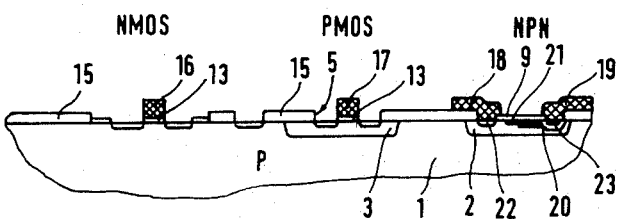

Then, in two masked ion-implantation steps following removal of the photoresist layers and exposure of the semiconductor surface beside the gate electrodes 16 and 17, first the impurities of the regions of the P-channel field-effect transistor and then, in the second step, those of the regions of the N-channel field-effect transistor are implanted as in conventional Si-gate technology. Unlike in the method mentioned at the outset, however, during the masked implantation of the impurities of the regions of the P-channel field-effect transistor, the impurities of a base contact region 21 are implanted into the semiconductor surface between the emitter electrode 19 and the collector region 18. In this step, the emitter electrode 19 and the collector electrode 18 work as a mask for the implantation of the impurities of the base contact region 21, as shown in FIG. 7. This masking step, too, is not critical with regard to a precise alignment of the implantation mask, because the edges of the mask are defined by the edges of the thick oxide layer 15, of the emitter electrode 19, and of the collector electrode 18. It is, therefore, nearly impossible for the base contact region 21 to miss the base region 20.

Special care must, however, be taken in aligning the photoresist mask for producing the electrodes 16, 17, 18, and 19 in relation to the edges of the thin oxide layer 9. The overlapping of the thin oxide layer 9 by the collector electrode 18 influences the collector-to-base breakdown voltage. In addition, a certain minimum distance is necessary between the base contact region 21 and the emitter region 23 at the semiconductor surface.

To save space, the N-channel field-effect transistor should be fabricated by the same procedure as that shown in FIG. 7 for the P-channel field-effect transistor. In this P-channel field-effect transistor, the edges of the regions, except the edge defined by the electrode 17, are determined by the edges of the opening 5 in the thick oxide layer 15. Like in the bipolar transistor, the openings 4 and 5 in the thin oxide layer 10 should each be divided by a stripelike thin oxide layer 13, which is used as a gate oxide layer. This has the advantage of permitting non-critical adjustment in the longitudinal directions of the thin oxide layers 13. The contacts to the regions and electrodes as well as the interconnecting paths are finally formed in the known manner.

A further reduction in the amount of area required on the wafer is obtained by using processes with self-adjusting electrodes, in which the gate electrodes 16 and 17 are oxidized at the surface at the expense of a certain overlap of the electrodes at the regions of the field-effect transistors over the oxide layer. In this connection, reference is made to "NTG-Fachberichte", Vol. 77, pages 22 to 29. This technology employing self-adjusting contacts saves component space, but the price paid for this is a considerable increase in the capacitances between the gate electrodes and the contacts at the regions of the field-effect transistors, which are generally of aluminum. In addition, because of the overlap necessary for reasons of adjustment, the gate lengths of the field-effect transistors must be increased, which has a negative effect on the frequency characteristic as well. The use of such self-adjusting contacts is thus limited to relatively slow circuits.

Figure 8:
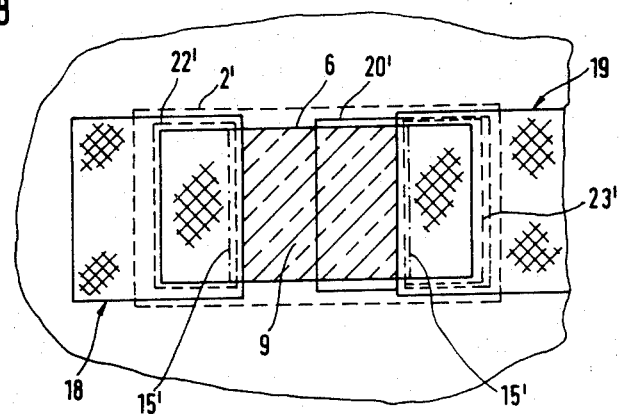
FIG. 8 is a top view of the bipolar transistor of FIG. 7.

FIG. 8 shows a top view of an enlarged portion of the solid-state integrated circuit of FIG. 7 with the bipolar transistor. The arrow 6 points to the edge of the opening in the thick oxide layer 15. The PN junction area of the collector region 2 appears at the semiconductor surface along the dashed line 2', while the n-type electrodes 19 and 18 are in contact with the semiconductor surface through the openings 15'. Accordingly, the overlap of the electrodes 18 and 19 over the thin oxide layer 9 is determined by the distance of the dashed line 15' from the edges of the electrodes 18 and 19 (continuous lines). The PN junction areas of the collector contact region 22 and the emitter region 23 appear at the semiconductor surface at the dashed lines 22' and 23', respectively. During the high-temperature process used to diffuse the PN junctions of the emitter region 23 and the collector contact region 22, the impurities of the regions of the field-effect transistors and those of the base region 20 and the base contact region 21 of the bipolar transistor are activated and diffused into the semiconductor body. The space requirement of the NPN planar transistor is only 15% greater than that of the PMOS field-effect transistor.

Another advantage of the method according to the invention is that other transistor devices can be fabricated simultaneously on the same substrate without requiring any additional steps. A lateral-PNP transistor is obtained by using the substrate region of a PMOS field-effect transistor structure as the base region. Contact to the substrate region 3 is formed by means of the n-type electrode material, preferably n-type polysilicon. Vertical substrate PNP transistors are obtained from the NPN transistor by omitting the emitter region. With the method according to the invention, it is thus readily possible to form complementary bipolar transistors, too.

In the method according to the invention, the substrate regions 2 and 3 may also be delineated and electrically isolated from an epitaxial layer of one conductivity type on a substrate 1 of the other conductivity type by oxidation and diffusion of substrate-type impurities penetrating the epitaxial layer.

I claim:

1. A method for the monolithic integration of a semiconductor circuit having at least one pair of complementary field effect transistors (FET's) having gate electrodes of an n-type material and at least one NPN bipolar transistor comprising the steps of:
   forming a first substrate region for said bipolar transistor and a second substrate region for a P-channel FET in one surface of a p-type semiconductor substrate;
   providing a thick oxide layer on said surface having an opening formed in the areas of said first substrate regions a second opening formed in the area of said second substrate region and a third opening formed in the area of an N-channel FET;
   closing said opening and said first and second openings with thin oxide layers during a gate oxidation process;
   exposing said surface in said opening to form an emitter region area and a collector contact region area of said bipolar transistor with a stripelike configuration of said thin oxide layer disposed between said emitter region area and said collector contact region and dividing said opening;
   implanting impurities of the conductivity type of said substrate into said emitter region area and an adjacent portion of said bipolar transistor below said thin oxide layer;
   depositing an n-type electrode material layer;
   etching away unwanted portions of said n-type electrode material layer to form gate electrodes for said pair of FET's, and emitter and collector electrodes for said bipolar transistor;
   implanting impurities of the regions of the N-channel FET by masked ion implantation;
   implanting impurities of the regions of the P-channel FET by masked ion implantation while simultaneously implanting impurities of a base contact region between said emitter and collector electrodes; and
   subjecting said substrate to a high temperature to activate said implanted impurities of said P and N channel FET's and to diffuse impurities in said emitter region area from said emitter electrode and to diffuse impurities in said collector contact region area from said collector electrode.

2. A method in accordance with claim 1 wherein said opening is rectangular.

3. A method in accordance with claim 1 wherein said etching step produces said collector electrode such that said collector electrode overlaps one edge of said stripelike thin oxide layer along the entire length of said edge.

4. A method in accordance with claim 1 comprising the intermediate steps of exposing said surface in said second opening to produce a second stripelike configuration of said thin oxide layer dividing said second opening, said second stripelike configuration being under said n-type electrode material layer; and
   exposing said surface in said third opening to provide a stripelike configuration of said thin oxide layer dividing said third opening, said third stripelike configuration being under said n-type electrode material layer.

5. A method in accordance with claim 2 wherein said etching step produces said collector electrode such that said collector electrode overlaps one edge of said stripelike thin oxide layer along the entire length of said edge.

6. A method in accordance with claim 2 comprising the intermediate steps of exposing said surface in said second opening to produce a second stripelike configuration of said thin oxide layer dividing said second opening, said second stripelike configuration being under said n-type electrode material layer; and
   exposing said surface in said third opening to provide a stripelike configuration of said thin oxide layer dividing said third opening, said third stripelike configuration being under said n-type electrode material layer.

7. A method in accordance with claim 3 comprising the intermediate steps of exposing said surface in said second opening to produce a second stripelike configuration of said thin oxide layer dividing said second opening, said second stripelike configuration being under said n-type electrode material layer; and
   exposing said surface in said third opening to provide a stripelike configuration of said thin oxide layer dividing said third opening, said third stripelike configuration being under said n-type electrode material layer.

8. A method in accordance with claim 5 comprising the intermediate steps of exposing said surface in said second opening to produce a second stripelike configuration of said thin oxide layer dividing said second opening, said second stripelike configuration being under said n-type electrode material layer; and
   exposing said surface in said third opening to provide a stripelike configuration of said thin oxide layer dividing said third opening, said third stripelike configuration being under said n-type electrode material layer.

* * * * *